United States Patent [19]

Fatehi et al.

[11] Patent Number: 5,537,243
[45] Date of Patent: Jul. 16, 1996

[54] ALL-OPTICAL FLIP-FLOP

[75] Inventors: Mohammad T. Fatehi; Clinton R. Giles, both of Middletown, N.J.

[73] Assignee: AT&T Corp., Murray Hill, N.J.

[21] Appl. No.: 168,317

[22] Filed: Dec. 17, 1993

[51] Int. Cl.⁶ ..................................................... G02F 3/00
[52] U.S. Cl. ............................................. 359/541; 359/108
[58] Field of Search ................................. 359/341, 107, 359/108, 239, 243, 244

[56] References Cited

U.S. PATENT DOCUMENTS

| | | | |
|---|---|---|---|
| 3,984,785 | 10/1976 | Riseberg et al. | 350/354 |
| 4,573,767 | 3/1986 | Jewell | 350/354 |
| 4,761,060 | 8/1988 | Sawano | 350/354 |
| 4,900,115 | 2/1990 | Heuring et al. | 350/96.15 |
| 5,088,095 | 2/1992 | Zirngibl | 372/6 |
| 5,128,800 | 7/1992 | Zirngibl | 359/341 |
| 5,155,780 | 10/1992 | Zirngibl | 385/27 |
| 5,229,876 | 7/1993 | Fatehi et al. | 359/160 |

FOREIGN PATENT DOCUMENTS

| | | | |
|---|---|---|---|
| 0519648A3 | 11/1992 | European Pat. Off. | 3/2 |
| 2118765 | 11/1983 | United Kingdom | 3/23 |

OTHER PUBLICATIONS

Revue De physique Appliquee, vol. 22, No. 10, Oct. 1987, Paris France, pp. 1287–1295, J. L. Oudar et al., "Bistabilite Optique des Lasers Couples".

European Search Report; Application EP 94 30 8904, Mar. 22, 1995.

"Gain Control In Erbium–Doped Fibre Amplifiers By All–Optical Feedback Loop", Electronics Letters, 28 Mar. 1991, vol. 27, No. 7, pp. 560–561.

*Primary Examiner*—Mark Hellner
*Attorney, Agent, or Firm*—Mark K. Young

[57] ABSTRACT

An all-optical flip-flop device is achieved by employing two optical amplifiers arranged so that they together operate in only one of two stable states at a given time. In a first stable state of operation, the first optical amplifier behaves as a laser having a first predetermined characteristic wavelength. The arrangement is switched to a second stable state of operation in which the second optical amplifier behaves as a laser having a second characteristic wavelength, where the first and second characteristic wavelengths are at least nominally different, when an optical signal pulse is received at the input of the first optical amplifier. The arrangement is switched back to the first stable state when an optical signal pulse is received at the input of the second optical amplifier.

23 Claims, 5 Drawing Sheets

FIG. 1

PRIOR ART

ALL-OPTICAL FLIP-FLOP

CROSS-REFERENCE TO RELATED APPLICATION

U.S. patent application Ser. No. (M. Fatehi 6–16) was filed concurrently herewith.

TECHNICAL FIELD

This invention relates generally to optics and, more particularly to an all-optical flip-flop device.

BACKGROUND OF THE INVENTION

All-optical signal processing and telecommunication devices are presently being developed to exploit the high speed, immunity to electromagnetic interference, very large bandwidth and capacity, and low loss, distortion and crosstalk characteristics of guided-wave lightwave technology, particularly in forms using optical fiber. "All optical" means the devices not only have optical inputs and outputs, but all intermediate signal processing is accomplished optically rather than electrically. All-optical devices are more desirable than opto-electrical devices which convert an optical signal into an electrical analog because a signal remaining in the single optical domain can make best use of the inherent advantages of lightwave technology. In addition, all-optical systems generally require less components and are less complex than their opto-electric counterparts performing similar functions.

One of the first areas to develop in all-optical signal processing was optical amplification with the advent of semiconductor optical amplifiers and rare-earth-doped amplifying optical fibers such as erbium-doped optical fibers. Rare-earth-doped amplifying optical fibers exhibit low noise, relatively large, polarization-independent bandwidth, reduced cross-talk, low insertion loss, and are relatively inexpensive to fabricate. Thus, all-optical amplifiers offer substantial performance advantages over competing opto-electrical amplifier technology.

Clearly, there is a need for more all-optical devices, beyond optical amplification, to further exploit the inherent advantages of lightwave technology in digital applications. For example, while electrical flip-flop devices have existed for many years, an all-optical flip-flop device has not yet been realized. An all-optical flip-flop would facilitate the implementation of all-optical sequential logic and bit-storage devices. Present optical bit-storage devices using electrical intermediate signal processing and fiber delay lines, while operating satisfactorily in certain applications, are not suitable for other applications due to the inherent limitations possessed by all opto-electrical devices.

SUMMARY OF THE INVENTION

An all-optical flip-flop device is achieved by employing two optical amplifiers arranged so that they together operate in only one of two stable states at a given time. In a first stable state of operation, the first optical amplifier behaves as a laser having a first characteristic wavelength. The arrangement is switched to a second stable state of operation in which the second optical amplifier behaves as a laser having a second characteristic wavelength, wherein the first and second characteristic wavelengths are at least nominally different, when an optical signal pulse is received at the input of the first optical amplifier. The arrangement is switched back to the first stable state when an optical signal

2 pulse is received at the input of the second optical amplifier.

The all-optical flip-flop device may be advantageously used in a variety of different digital applications. For example, the all-optical inverter may be advantageously used as an all-optical shift register and as an all-optical digital storage device.

DETAILED DESCRIPTION

Figure 1:
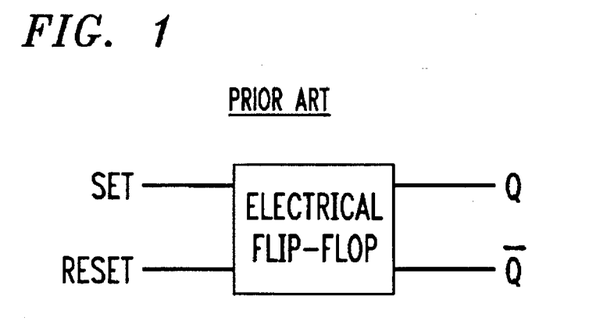
FIG. 1 shows a schematic drawing of an electrical flip-flop device known in the prior art.

Prior art electrical flip-flop devices typically have two input ports, including SET and RESET, and two output ports, including Q and $\overline{Q}$ ("not Q") as shown in FIG. 1. If a signal pulse is received by the SET input port, then the Q output port emits a signal while the $\overline{Q}$ output port emits a null signal (i.e., no signal). The flip-flop latches, or holds this operating condition, until a signal is received by the RESET input port. This latched condition, where a signal is output at the Q output port, is a stable state of operation. If a signal pulse is received by the RESET input port, then the emissions of the output ports are reversed (i.e., the output ports flip-flop). The Q output port that was previously emitting a signal now emits a null signal, and the $\overline{Q}$ output port that was previously emitting a null signal now emits a signal. The electrical flip-flop operates in this stable state until a signal is received by the SET input port, at which time the output ports flip-flop again.

Figure 2:
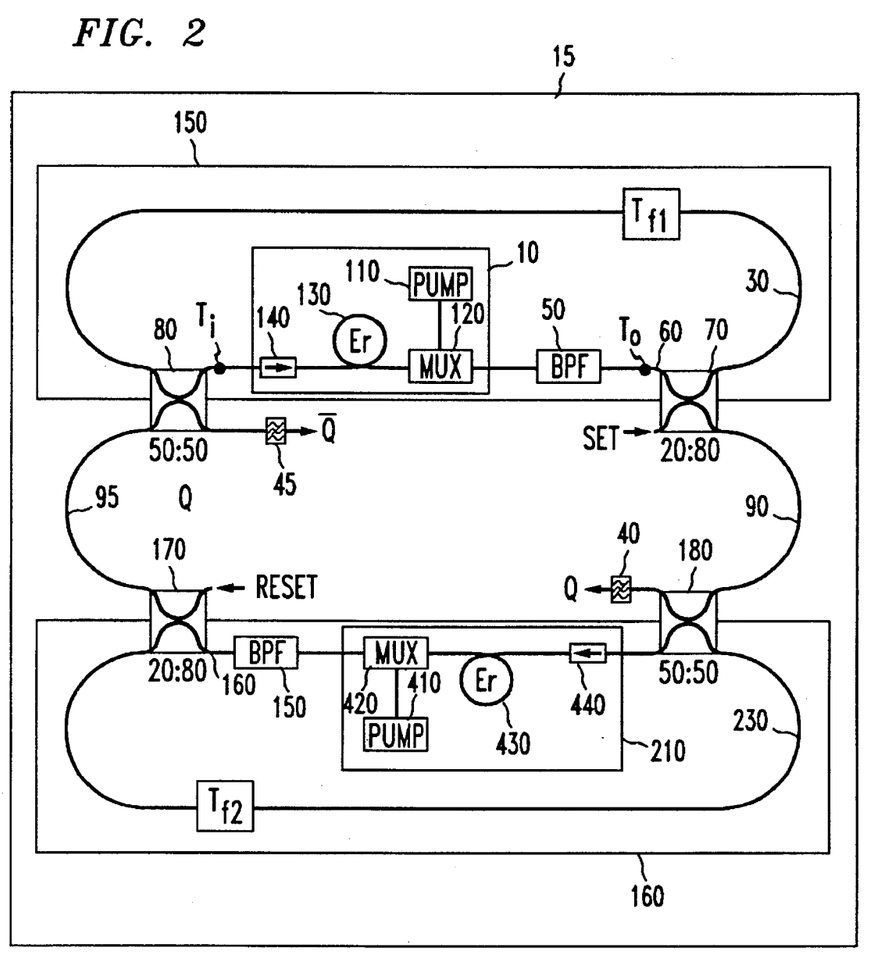
FIG. 2 shows a simplified schematic representation of an illustrative arrangement of elements, including two optical amplifiers, forming an all-optical flip-flop device in accordance with the principles of the invention.

FIG. 2 shows a simplified schematic representation of an illustrative arrangement of elements forming all-optical flip-flop 15, including optical amplifiers 150 and 160, in accordance with the principles of the invention. In optical amplifier 150, feedback path 30, comprised of a doped or undoped optical fiber, couples the output of erbium-doped fiber amplifier (EDFA) 10 to its input. It will be appreciated by those skilled in the art that it may be desirable in some applications, to use a rare-earth-doped fiber in feedback path 30 acting as a saturable attenuator. The advantageous use of attenuators is described in further detail below.

In the illustrative arrangement of FIG. 2, EDFA 10 is comprised of pump 110, multiplexer 120, erbium-doped fiber 130, and optical isolator 140 arranged such that the light from pump 110 travels counter-directionally with the signal. Each of these components and the functions employed therein are well known in the art. In some applications, it may be desirable to arrange the components in EDFA 10 in such a way that the light from pump 110 travels co-directionally, or bi-directionally with the signal.

Optical bandpass filter 50 is positioned in forward path 60 between the output of EDFA 10 and output optical coupler 70. Forward path 60 is comprised of an undoped optical fiber. Output optical coupler 70 couples a predetermined portion of the signal propagating in forward path 60 to feedback path 30. Input optical coupler 80 couples a predetermined portion of the signal propagating in feedback path 30 to the input of EDFA 10. For purposes of this illustrative example, and not as a limitation on the invention, output optical coupler 70 couples 20% of the signal propagating in forward path 60 to feedback path 30 and 80% of the signal to coupling fiber 90. Similarly, input optical coupler 80 couples 50% of the signal propagating in feedback path 30 to the input of EDFA 10 and 50% of the signal to output port $\overline{Q}$. In this example, both output optical coupler 70 and input optical coupler 80 may be 7 db optical couplers that are well known in the art.

In optical amplifier 160, feedback path 230, comprised of a doped or undoped optical fiber, couples the output to the input of EDFA 210. Feedback path 230 and EDFA 210 are identical to feedback path 30 and EDFA 10, respectively, in optical amplifier 150 in structure and operation. EDFA 210 is comprised of pump 410, multiplexer 420, erbium-doped fiber 430, and optical isolator 440. These elements are identical in structure and operation to those corresponding elements comprising EDFA 10 as described above.

Optical bandpass filter 150 is positioned in forward path 160 between the output of EDFA 210 and output optical coupler 170. Optical bandpass filter 150, forward path 160, and output coupler 170 are identical to optical bandpass filter 50, forward path 60, and output coupler 70, respectively, in optical amplifier 150 in structure and operation. Output optical coupler 170 couples a predetermined portion of the signal propagating in forward path 160 to feedback path 130. Input optical coupler 180 couples a predetermined portion of the signal propagating in feedback path 130 to the input of EDFA 210. Input optical coupler 180 is identical to input optical coupler 80 in optical amplifier 150 in structure and operation.

The output of optical amplifier 150 is coupled to the input of optical amplifier 160 via output coupler 70, coupling fiber 90, and input coupler 180. Similarly, the output of optical amplifier 160 is coupled to the input of optical amplifier 150 via output coupler 170, coupling fiber 95, and input coupler 80. Coupling fibers 90 and 95 comprise undoped optical fibers.

One end of coupling fiber 90 functions as the SET input port to all-optical flip-flop is and the other end of coupling fiber 90 functions as the Q output port. One end of coupling fiber 95 functions as the RESET input port to all-optical flip-flop 15 and the other end of coupling fiber 95 functions as the $\overline{Q}$ output port. Optical bandpass filter 40, tuned to pass signal wavelengths substantially equal to $\lambda_A$, is positioned at the end of coupling fiber 90 at the Q output port. Optical bandpass filter 45, tuned to pass signal wavelengths substantially equal to $\lambda_B$, is positioned at the end of coupling fiber 95 at the $\overline{Q}$ output port.

In operation, when there is no optical pulse signal present at the RESET input, the amplified spontaneous emission (ASE) from EDFA 10 is filtered at wavelength $\lambda_A$ by optical bandpass filter 50 as it propagates along forward path 60. ASE is generated by EDFA 10 from the amplified light produced by the spontaneous emission of excited erbium ions from erbium-doped fiber 130. As discussed above, 20% of the filtered ASE is coupled from the output of EDFA 10 through output optical coupler 70 to feedback loop 30. Input optical coupler 80 allows 50% of the ASE to be re-injected as a feedback signal to the input of EDFA 10. This feedback signal is sufficient to cause stimulated emission in EDFA 10 which results in self-sustaining lasing output by optical amplifier 150 at wavelength $\lambda_A$. The remaining 50% of the signal propagating in feedback path 30 is coupled by input optical coupler 80 to the $\overline{Q}$ output port where it is blocked by optical bandpass filter 45 since optical bandpass filter 45 is tuned to pass wavelengths at $\lambda_B$ and the signal has a wavelength of $\lambda_A$.

The following mathematical exposition should prove useful to one skilled in the art in the understanding of the detailed operation of the self-sustaining laser operation discussed above. The input and output photon fluxes to erbium-doped fiber 130 are related through coupled implicit equations:

$$q^{out}_{\lambda_i} = q^{in}_{\lambda_1} \exp\left[ \frac{(\alpha_{\lambda_1} + g^*_{\lambda_i})}{\zeta} (q^{in} - q^{out}) - a_{\lambda_i}L \right] \quad i=1,2,p \quad (1)$$

and $$q^{in,out} = \sum_i q^{in,out}_{\lambda_i} \quad (2)$$

where $\lambda_1$ is the wavelength of the input signal, $\lambda_2$ is the wavelength of the output signal, $\lambda_p$ is the wavelength of the pump light in EDFA 10, q are the photon fluxes entering and exiting erbium-doped fiber 130, $\alpha$ and g* are absorption and emission coefficients at the control and pump wavelengths, respectively, $\zeta$ is a saturation parameter, and L is the length of erbium-doped fiber 130.

Feedback path 30 fixes the relationship between input and output of EDFA 10 at wavelength $\lambda_2$:

$$q^{in}_{\lambda_2} = T_{in}T_{out}T_{f1}F_{in}F_{out}q^{out}_{\lambda_2} = T_1 F_{in} F_{out} q^{out}_{\lambda_2} \quad (3)$$

where $T_{in}$, and $T_{out}$ are the transmissivity of the optical components at the input and output of EDFA 10, and $T_{f1}$ is the transmissivity of feedback path 30, $T_1 = T_{in} T_{out} T_f$, and $F_{in}$ and $F_{out}$ are the coupling ratios of input optical coupler 80 and output optical coupler 70, respectively.

Equations (1) to (3) reduce to an explicit equation for the output of EDFA 10, valid above the lasing threshold, that depends linearly on the pump and input signal powers:

$$Q^{out}_{\lambda_2} = \frac{T_{out}(1-F_{out})}{1-T_1 F_{in} F_{out}} \left[ Q^{in}_{\lambda_2}(1-H_{\lambda_p}) + (1-F_{in})T_{in}Q^{in}_{\lambda_1}(1-H_{\lambda_1}) \frac{\zeta}{\alpha_{\lambda_2}+g^*_{\lambda_2}} (\alpha_{\lambda_2}L - \ln(T_1 F_{in} F_{out})) \right] \quad (4)$$

where the transfer function $H_{\lambda_i}$ is defined as:

$$H_{\lambda_i} = \frac{\alpha_{\lambda_i}+g^*_{\lambda_i}}{\alpha_{\lambda_2}+g^*_{\lambda_2}} (\alpha_{\lambda_2}L - \ln(T_1 F_{in} F_{out})) - \alpha_{\lambda_i}L \quad i=1,p \quad (5)$$

and $Q_{\lambda_i}$ are the photon fluxes entering and exiting EDFA 10. For equations (4) and (5) to be valid, EDFA 10 must be operating as a laser which requires that total gain through the combination of forward path 60 and feedback path 30 be equal or greater than unity. It will be apparent to those skilled in the art that the gain through the combination of forward path 60 and feedback path 30 may be readily controlled by changing the fraction of light propagating in feedback path 30 by changing the coupling ratios of output coupler 70 and input coupler 80. Alternatively, it may be desirable to include a controllable attenuation element positioned in feedback path 30 to control the gain through the combination of forward path 60 and feedback path 30.

Figure 3:
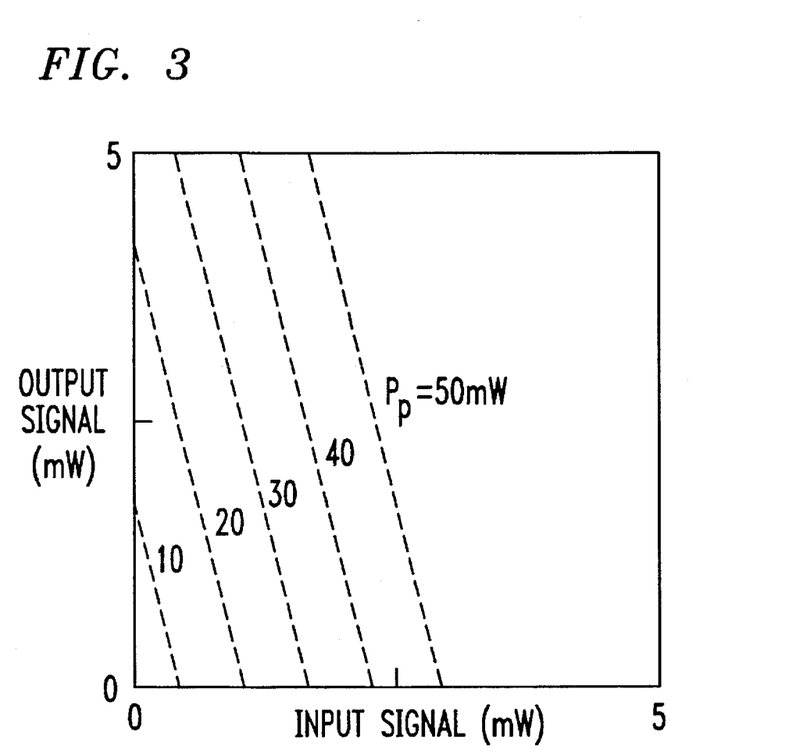
FIG. 3 is a graph of the calculated output power of the optical amplifiers used in the embodiment of FIG. 2 as a function of the input signal power for various levels of pump power.

FIG. 3 shows a graph of equation (4) where the calculated output power of EDFA 10 in optical amplifier 150 is plotted as a function of input signal power under the following illustrative conditions:

$\lambda_p$=980 nm $\lambda_1$=1560 nm $T_{in}=T_{out}$=0.8

$T_f$=0.5

$F_1=F_2$=0.5

L=13 m $\zeta=1.5 \times 10^{15} m^{-1} s^{-1}$ $\alpha$=0.38 $m^{-1}$ g*=0.62 $m^{-1}$ The slope (or "gain") of the transfer function $H_{\lambda_i}$ is independent of pump power and is determined by principally by the transmissivity terms, $T_{in}$, $T_{out}$, and $T_f$, and coupling ratios $F_{in}$ and $F_{out}$. Indeed, where $\lambda_1 \approx \lambda_2$, $\alpha\lambda_1 = \alpha\lambda_2$, and $g_{\lambda_1}^* = g_{\lambda_2}^*$, the gain transfer function reduces to:

$$\frac{dQ_{\lambda_2}}{dQ_{\lambda_1}} = -\frac{(1-F_{in})(1-F_{out})}{T_f F_{in} F_{out}} \qquad (6)$$

Thus, high transfer function gain is achieved with weak feedback characterized by a small $T_f F_{in} F_{out}$ term. This results because EDFA 10 is clamped to high gain so that the input signal also experiences high gain which readily saturates the output power of EDFA 10. It will be readily appreciated to those skilled in the art that the $T_f F_{in} F_{out}$ term may be advantageously adjusted to alter the gain characteristics of all-optical flip-flop 15 by changing, for example, transmissivity $T_f$ of the feedback path 30 by incorporating a controllable attenuation element into feedback path 30. Alternatively, it may also be desirable to incorporate other elements into feedback path 30 such as saturable or controllable absorbers, and modulators.

Returning back to FIG. 2, output optical coupler 70 couples a predetermined portion of the laser output of optical amplifier 150 to coupling fiber 90. As stated above, for purposes of this example, output optical coupler 70 couples 80% of the signal propagating in forward path 60 to coupling fiber 90. Input optical coupler 180 couples 50% of the signal propagating in coupling fiber 90 to optical bandpass filter 40 as an output at the Q output port. The remaining 50% of the signal is coupled to the input of EDFA 210 in optical amplifier 160. This coupled laser output from optical amplifier 150 saturates EDFA 210 so that the gain through EDFA 210 is reduced below the threshold necessary for EDFA 210 to operate as a self-sustaining laser in the manner described above.

Although EDFA 210 is saturated by the output of optical amplifier 150 to prevent lasing, the ASE generated in EDFA 210 propagates through optical bandpass filter 150, where it is filtered at $\lambda_B$. The ASE then propagates along forward path 160 to output coupler 170. Output coupler 170 couples 80% of this filtered signal to coupling fiber 95 and optical bandpass filter 45 via input coupler 80 where it is output at the $\overline{Q}$ output port. The remaining 20% of the signal from coupler 170 is coupled to feedback path 230 and input coupler 180. Input coupler 180 couples 50% of the signal propagating in feedback path 230 to the Q output port where it is blocked by optical bandpass filter 40 since optical bandpass filter 40 is tuned to pass wavelengths at $\lambda_A$ and the signal propagating in feedback path 230 has a wavelength of $\lambda_B$. The remaining 50% of the signal propagating in feedback path 230 is coupled by optical coupler 180 as a feedback signal to the input of EDFA 210. This feedback signal does not cause EDFA 210 in optical amplifier 160 to lase since EDFA 210 is already saturated by the laser output of optical amplifier 150 as discussed above.

Thus, in the first stable state of operation where optical amplier 150 is lasing and optical amplifier 160 is saturated, all-optical flip-flop 15 generates a strong signal at the Q output port at wavelength $\lambda_A$, and a weak signal at the $\overline{Q}$ output port at wavelength $\lambda_B$.

Figure 4:
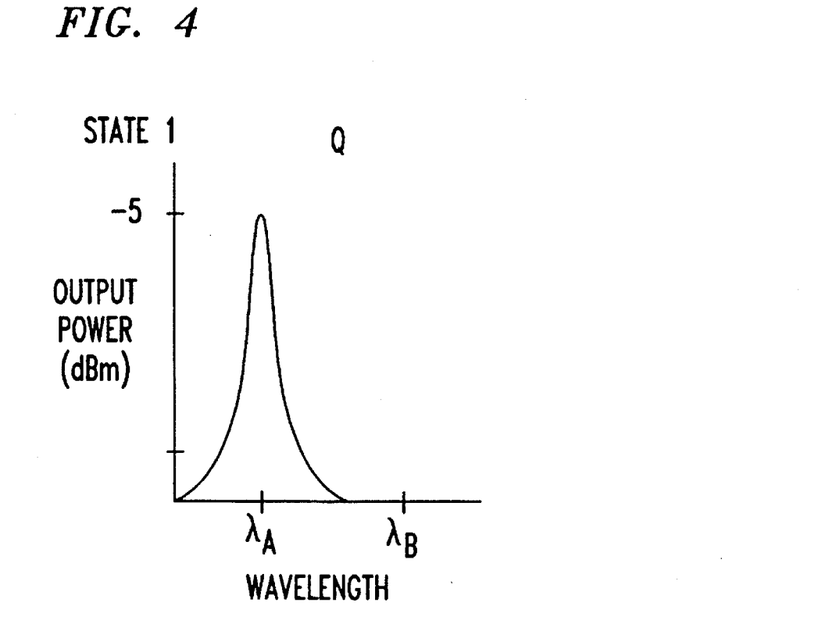
FIG. 4 is a graph of the output power at the Q output port of the all-optical flip-flop device when it is operating in its first stable state of operation.

FIG. 4 is a graph of the output power at the Q output port of all-optical flip-flop 15 when it is operating in its first stable state of operation applying the illustrative operating conditions described above when referring to FIG. 3, and where $\lambda_A$=1544 nm and $\lambda_B$=1566 nm. FIG. 4 shows the strong and narrow peak that is characteristic of laser output.

Figure 5:
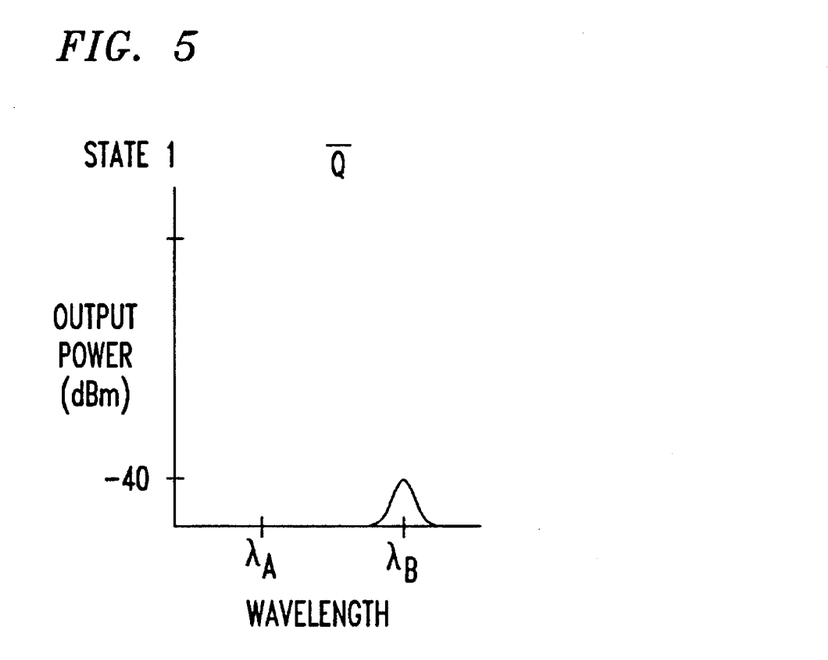
FIG. 5 is a graph of the output power at the $\overline{Q}$ output port of the all-optical flip-flop device when it is operating in its first stable state of operation.

FIG. 5 is a graph of the output power at the $\overline{Q}$ output port of all-optical flip-flop 15 when it is operating in its first stable state of operation. The power output here is sharply reduced as compared to the Q output port because only ASE from EDFA 210 at wavelength $\lambda_B$ can pass through optical bandpass filters 150 and 45. The extinction ratio between Q and $\overline{Q}$ output ports has been shown to be typically about 40 dB under the illustrative operating conditions discussed when referring to FIG. 3, and where $\lambda_A$=1544 nm and $\lambda_B$=1566 nm. All-optical flip-flop 15 holds this first stable state of operation indefinitely, or until it is switched to the second stable state of operation as discussed below.

All-optical flip-flop 15 is switched to its second stable state of operation when an optical signal pulse, having a wavelength within the gain bandwidth of EDFA 10, is received at the RESET port. Output optical coupler 170 couples 80% of the optical signal pulse from the RESET port to optical input coupler 80 via coupling fiber 95. Optical input coupler 80 couples 50% of the pulse signal from coupling fiber 95 into the input of EFDA 10 in optical amplifier 150. If this pulse signal coupled to the input of EFDA 10 is of sufficient power and duration, then EDFA 10 becomes saturated which reduces the gain through EDFA 10 below the threshold necessary for optical amplifier 150 to operate as a self-sustaining laser in the manner described above. Under the illustrative conditions described above when referring to FIG. 3 and where $\lambda_A$=1544 nm and $\lambda_B$=1566 nm, we have found that an optical signal pulse with −8 dBm input power with a minimum pulse duration of 100 μsec is sufficient to saturate EDFA 10.

When EDFA 10 in optical amplifier 150 is saturated so that it cannot lase, then its output to optical amplifier 160 via optical couplers 70 and 180 and coupling fiber 90 is no longer sufficient to saturate EFDA 210 in optical amplifier 160 below its lasing threshold. Optical amplifier 160 is then free to lase in the ASE feedback manner described above. Of course, optical amplifier 160 will lase at a wavelength $\lambda_B$ since optical bandpass filter 150 is tuned to $\lambda_B$.

The laser output of optical amplifier 160, at wavelength $\lambda_B$, is coupled to optical amplifier 150 via couplers 170 and 80 and coupling fiber 95. This coupled laser output causes optical amplifier 150 to remain saturated below is lasing threshold after the optical signal pulse at the RESET port has elapsed.

Thus, in the second stable state of operation where optical amplifier 160 is lasing and optical amplifier 150 is saturated, all-optical flip-flop 15 generates a strong signal at the $\overline{Q}$ output port at wavelength $\lambda_B$, and a weak signal at the Q output port at wavelength $\lambda_A$.

Figure 6:
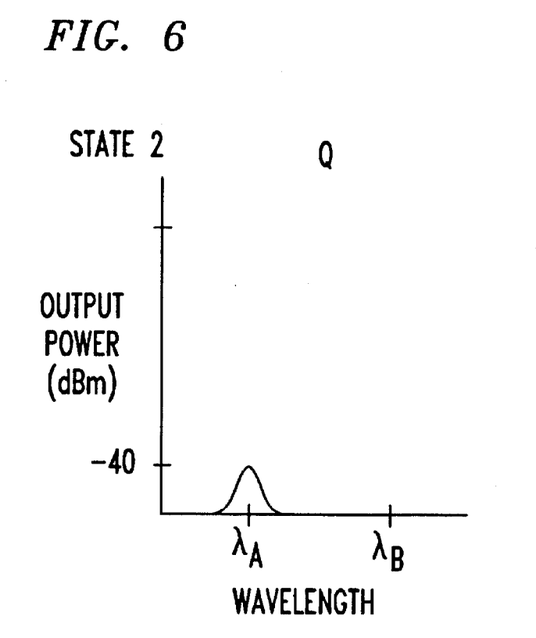
FIG. 6 is a graph of the output power at the Q output port of the all-optical flip-flop device when it is operating in its second stable state of operation.

FIG. 6 is a graph of the output power at the Q output port of all-optical flip-flop 15 when it is operating in its second stable state of operation applying the illustrative operating conditions described above when referring to FIG. 3 and where $\lambda_A$=1544 nm and $\lambda_B$=1566 nm. The power output here is sharply reduced as compared to the $\overline{Q}$ output port because only ASE from EDFA 10 at wavelength $\lambda_A$ can pass through optical bandpass filters 50 and 40.

Figure 7:
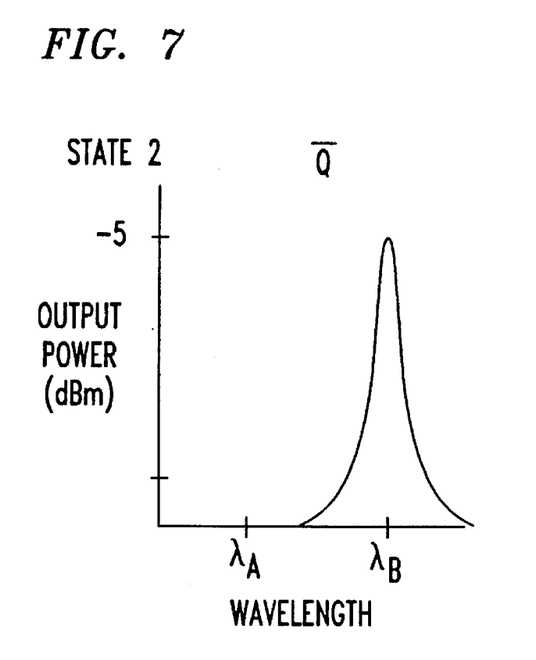
FIG. 7 is a graph of the output power at the $\overline{Q}$ output port of the all-optical flip-flop device when it is operating in its second stable state of operation.

FIG. 7 is a graph of the output power at the $\overline{Q}$ output port of all-optical flip-flop 15 when it is operating in its second stable state of operation. FIG. 6 shows the strong and narrow peak that is characteristic of laser output. The extinction ratio between $\overline{Q}$ and Q output ports has been shown to be typically about 40 dB under the illustrative operating conditions discussed when referring to FIG. 3. All-optical flip-flop 15 holds this second stable state of operation indefinitely, or until it is switched to the first stable state of operation as discussed below.

All-optical flip-flop 15 is switched to its first stable state of operation when an optical signal pulse, having a wavelength within the gain bandwidth of EDFA 210, is received at the SET port. Output optical coupler 70 couples 80% of the optical signal pulse from the SET port to optical input coupler 180 via coupling fiber 90. Optical input coupler couples 50% of the pulse signal from coupling fiber 90 into the input of EFDA 210 in optical amplifier 160. As before, when discussing the switching from the first to second stable states, if this pulse signal coupled to the input of EFDA 210 is of sufficient power and duration, then EDFA 210 becomes saturated which reduces the gain through EDFA 210 below the threshold necessary for optical amplifier 160 to operate as a self-sustaining laser. When optical amplifier 160 stops lasing, then optical amplifier 150 is no longer saturated by the laser output and becomes free to lase in the ASE feedback manner described above. The laser output of optical amplifier 150, at wavelength $\lambda_A$, is coupled to optical amplifier 160 via couplers 70 and 180 and coupling fiber 90. This coupled laser output causes optical amplifier 150 to remain saturated below is lasing threshold after the optical signal pulse at the SET port has elapsed.

Figure 8:
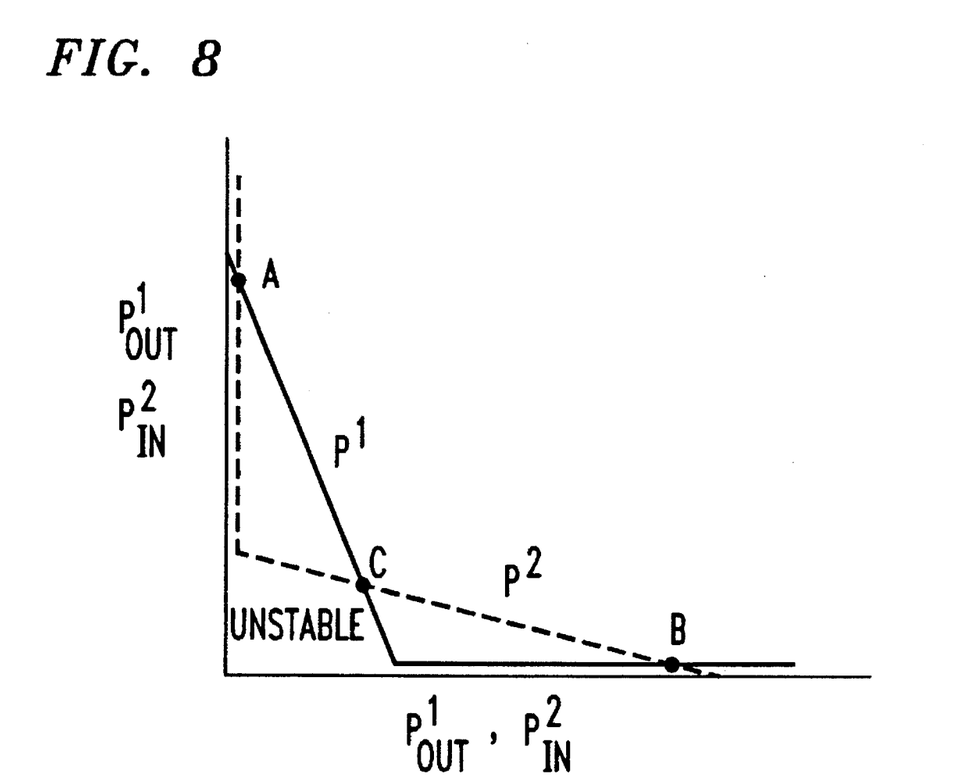
FIG. 8 is a graph of the transfer functions for the two optical amplifiers employed by the all-optical flip-flop device showing two stable states of operation, A and B, and one unstable state, C.

FIG. 8 is a graph of the transfer functions represented by equation (5) for both optical amplifiers 150 and 160 showing the first and second operating states for all-optical flip-flop 15 as points A and B. The intersection of the transfer functions at point C represents an unstable state of operation of all-optical flip-flop 15.

It will appreciated to those with skill in the art that all-optical flip-flop 15 may be used to implement, in an all-optical manner, all of the circuits presently implemented using electrical flip-flops. In addition, when combined with the appropriate all-optical logic gates implemented using all-optical inverters, as described in the U.S. patent application Ser. No. 08/168291 now U.S. Pat. No. 5,434,701, all-optical flip-flip 15 can be used to implement all-optical shift registers and bit-storage devices.

Those with skill in the art will also appreciate that all-optical flip-flop 15 may also be used to implement modulo-n (i.e., n-ary) optical logic circuits by utilizing its multi-wavelength operating characteristics. This characteristic would enable modulo-n logic devices to be realized because all-optical flip-flip 15 switches not only power at its outputs but also wavelength.

The above-described arrangements are, of course, merely illustrative of the application of the principles of the invention. Other arrangements may be devised by those skilled in the art without departing from the spirit or scope of the invention. For example, it will be apparent to those skilled in the art that a semiconductor optical amplifier may be advantageously employed in place of EDFA 10 and EDFA 210 in FIG. 2 to allow substantially faster switching of all-optical flip-flop 15. Such an all-optical flip-flop could thus be used in a photonic integrated circuit chip.

We claim:

1. Apparatus for use as an all-optical flip-flop device comprising:

first and second optical amplifiers each having an input and an output;

first feedback means having a signal path for coupling said output of said first optical amplifier to said input of said first optical amplifier so that said first optical amplifier operates in a first stable state by lasing at a first characteristic wavelength;

second feedback means having a signal path for coupling said output of said second optical amplifier to said input of said second optical amplifier so that said second optical amplifier operates in a second stable state by lasing at a second characteristic wavelength where said first and said second characteristic wavelengths are at least nominally different;

means for coupling said first and second optical amplifiers in a coupled arrangement so that said optical amplifiers operate in only one of said first and second stable states at a given time;

means for switching between said first and second stable states of operation in response to an optical pulse signal received at said input of said first optical amplifier; and means for switching between said second and first stable states of operation in response to an optical pulse signal received at said input of said second optical amplifier.

2. The apparatus as defined in claim 1 wherein said first and second optical amplifiers are erbium-doped fiber amplifiers.

3. The apparatus as defined in claim 1 wherein said first and second optical amplifiers are semiconductor lasers.

4. The apparatus of claim 1 wherein said means for coupling includes a first optical fiber for further coupling said output of said first optical amplifier to said input of said second optical amplifier.

5. The apparatus of claim 4 wherein said means for coupling further includes a second optical fiber for further coupling said output of said second optical amplifier to said input of said first optical amplifier.

6. The apparatus of claim 4 wherein said first optical fiber is selected from the group consisting of rare-earth doped optical fibers or undoped optical fibers.

7. The apparatus of claim 5 wherein said second optical fiber is selected from the group consisting of rare-earth doped optical fibers or undoped optical fibers.

8. The apparatus of claim 1 wherein said first or said second feedback means include a saturable absorber.

9. The apparatus of claim 4 wherein said first optical fiber is coupled to said output of said first optical amplifier using a first optical coupler.

10. The apparatus of claim 4 wherein said first optical fiber is coupled to said input of said second optical amplifier using a second optical coupler.

11. The apparatus of claim 5 wherein said second optical fiber is coupled to said output of said second optical amplifier using a third optical coupler.

12. The apparatus of claim 5 wherein said second optical fiber is coupled to said input of said first optical amplifier using a fourth optical coupler.

13. The apparatus of claim 9 wherein said coupling means includes a first bandpass filter disposed between said output of said first optical amplifier and said first coupler.

14. The apparatus of claim 11 wherein said coupling means includes a second bandpass filter disposed between said output of said second optical amplifier and said fourth coupler.

15. The apparatus of claim 4 further including a third bandpass filter disposed at an output end of said first optical fiber.

16. The apparatus of claim 5 further including a fourth bandpass filter disposed at an output end of said second optical fiber.

17. An all-optical flip-flop, comprising:
   first and second optical amplifiers each having an input and an output;
   a first optical fiber for feeding back a signal at said output of said first optical amplifier to said input of said first optical amplifier so that said first optical amplifier operates in a first stable state by lasing at a first characteristic wavelength;
   a second optical fiber for feeding back a signal at said output of said second optical amplifier to said input of said second optical amplifier so that said second optical amplifier operates in a second stable state by lasing at a second characteristic wavelength where said first and said second characteristic wavelengths are at least nominally different;
   a plurality of coupling fibers for coupling said first and second optical amplifiers in a coupled arrangement so that said optical amplifiers operate in only one of said first and second stable states at a given time;
   a reset port coupled to said input of said first optical amplifier for switching between said first and second stable states of operation in response to an optical pulse signal received at said reset port; and
   a set port coupled to said input of second optical amplifier for switching between said second and first stable states of operation in response to an optical pulse signal received at said set port.

18. The all-optical flip-flop of claim 17 wherein said first and second optical amplifiers are erbium-doped fiber amplifiers.

19. An all-optical flip-flop having a set port and a reset port, comprising:
   a first optical amplifier having an input and an output and having a feedback path coupling said output to said input to thereby allow said first optical amplifier to lase at a first characteristic wavelength; and
   a second optical amplifier having an input and an output and having a feedback path coupling said output to said input to thereby allow said second optical amplifier to lase at a second characteristic wavelength wherein said first and said second characteristic wavelengths are at least nominally different,
   wherein said first and said second optical amplifiers are operably coupled such that only one of said first and said second optical amplifiers can lase at a given time, and said first optical amplifier lases in response to an optical pulse signal received at said set port, and said second optical amplifier lases in response to an optical pulse signal received at said reset port.

20. The all-optical flip-flop of claim 19 wherein said first and second optical amplifiers are erbium-doped fiber amplifiers.

21. A method, comprising the steps of:
   coupling an output of a first optical amplifier to an input of said first optical amplifier so that said first optical amplifier operates in a first stable state by lasing at a first characteristic wavelength;
   coupling an output of said second optical amplifier to an input of said second optical amplifier so that said second optical amplifier operates in a second stable state by lasing at a second characteristic wavelength where said first and said second characteristic wavelengths are at least nominally different;
   coupling said first and second optical amplifiers in a coupled arrangement so that said optical amplifiers operate in only one of said first and second stable states at a given time;
   switching between said first and second stable states of operation in response to an optical pulse signal received at said input of said first optical amplifier; and
   switching between said second and first stable states of operation in response to an optical pulse signal received at said input of said second optical amplifier.

22. The method as defined in claim 21 wherein said first and second optical amplifiers are erbium-doped fiber amplifiers.

23. The method as defined in claim 21 wherein said first and second optical amplifiers are semiconductor lasers.

* * * * *